United States Patent [19]
Bour et al.

[11] Patent Number: 5,926,726
[45] Date of Patent: Jul. 20, 1999

[54] IN-SITU ACCEPTOR ACTIVATION IN GROUP III-V NITRIDE COMPOUND SEMICONDUCTORS

[75] Inventors: David P. Bour; G.A. Neville Connell, both of Cupertino; Donald R. Scifres, San Jose, all of Calif.

[73] Assignees: SDL, Inc., San Jose, Calif.; Xerox Corporation, Stamford, Conn.

[21] Appl. No.: 08/928,250

[22] Filed: Sep. 12, 1997

[51] Int. Cl.$^6$ .................................................. H01L 21/205
[52] U.S. Cl. .......................... 438/507; 438/508; 438/509
[58] Field of Search .................................. 438/478, 507, 438/508, 509; 257/190; 372/45; 117/952

[56] References Cited

U.S. PATENT DOCUMENTS

| 5,306,662 | 4/1994 | Nakamura et al. | 437/107 |
| 5,468,678 | 11/1995 | Nakamura et al. | 437/107 |
| 5,656,832 | 8/1997 | Ohba et al. | . |
| 5,740,192 | 4/1998 | Hatano et al. | . |

OTHER PUBLICATIONS

Hiroshi Amano et al, "P–Type Conduction in Mg–Doped GaN Treated with Low–Energy Electron Beam Irradiation (LEEBI)", *Japanese Journal of Applied Physics*, vol. 28, No. 12, Dec., 1989, pp. L2112–L2114.

Suji Nakamura et al., "Thermal Annealing Effects on P–Type Mg–Doped GaN Films", *Japanese Applied Physics*, vol. 31 (Part 2) No. 2B, Feb. 13, 1992, pp. L139–L–142.

Isamu Akaski et al., "Photoluminescence of Mg–doped p–tye GaN and Electroluminescence of GaN p–n junction LED", *Journal of Luminescence*, 48 & 49 (1991) pp. 666–670.

Hiroshi Amano et al., "Electron Beam Effects on Blue Luminescence of Zinc–doped GaN" Journal of Luminescence, 40 & 41 (1988) pp. 121–1.

W. Gotz et al., "Hydrogen Passivation of Mg Acceptors in GaN Grown by Metalorganic Chemical Vapor Deposition" Appl. Phys. Lett. 67 (18) Oct. 30, 1995, pp. 2666–2668.

Shuji Nakamura et al., "Hole Compensation Mechanism of P–type GaN Films" Jpn. J. Appl. Physics, vol. 31, Part 1, (1992), pp. 1258–1266.

Shuji Nakamura et al., "High–Brightness InGaN Blue, Green and Yellow Light–Emitting Diodes with Quantum Well Structures" Jpn. J. Appl. Physics, vol. 34, Part 2, No. 7A, Jul. 1, 1995, pp. L797–L799.

Shuji Nakamura et al., "Highly P–typePlatypus Mg–doped GaN Films Grown with GaN Buffer Layers" Japanese Journal of Applied Physics, vol. 30, No. 10A, Oct., 1991, p. L1708.

Shuji Nakamura et al., *The Blue Laser Diode*, copyright Springer–Verlag Berlin Heidelbert 1997, pp. 111–127.

(List continued on next page.)

*Primary Examiner*—Charles Bowers
*Assistant Examiner*—Keith Christiansa
*Attorney, Agent, or Firm*—W. Douglas Carothers, Jr.

[57] ABSTRACT

A method of manufacturing a p-type III–V nitride compound semiconductor utilizing vapor phase epitaxy is carried out in a MOCVD reactor by growing a III–V nitride compound semiconductor in the reactor employing a reaction gas containing a p-type impurity and then annealing in-situ the nitride compound semiconductor to bring about acceptor activation, the annealing carried out at a temperature below the growth temperature of the III–V nitride compound semiconductor during reactor cooldown. A nitrogen (N) reactant or precursor is provided in the reactor during the annealing step which can produce a reactive form of N capable of suppressing surface decomposition and does not produce atomic hydrogen. Also, acceptor activation is achieved through the employment of a cap layer comprising a n-type Group III–V nitride material, e.g., n-GaN, grown on the p-doped Group III–V nitride layer preventing the occurrence of hydrogenation of the underlying p-doped layer during cooldown. This non-post-growth activation eliminates the need for a subsequent thermal anneal step since any acceptor passivation is prevented in the first instance.

29 Claims, 3 Drawing Sheets

OTHER PUBLICATIONS

Shuji Nakamura et al., "Hold Compensation Mechanism of P–Type GaN Films", Jpn. J. Appl. Phys. vol. 31, May 1992, Part 1, No. 5A, pp. 1258–1266.

P.A. Grudowski et al., The Effect of Substrate Misorientation on the Photoluminescence Properties of GaN Grown on Sapphire by Metalorganic Chemical Vapor Deposition, Appl. Phys. Lett. 69 (24), Dec. 9, 1996, pp. 3626–3628.

Hiroshi Amano et al., "Growth and Luminescence Properties of Mg–Doped GaN Prepared by MOVPE", J. Electrochem. Soc., vol. 137, No. 5, May 1990, (The Electrochemical Society, Inc.).

P.A. Grudowski et al., "The Effect of Substrate Misorientation on the Optical, Structural, and Electrical Properties of GaN Grown on Sapphire by MOCVD" Journal of Electronic Materials, vol. 26, No. 3, 1997, Special Issue Paper, pp. 257–261.

IN-SITU ACCEPTOR ACTIVATION IN GROUP III–V NITRIDE COMPOUND SEMICONDUCTORS

STATEMENT AS TO RIGHTS TO INVENTIONS MADE UNDER FEDERALLY SPONSORED RESEARCH AND DEVELOPMENT

This invention was made with government support under Contract No. 70NAN B2H1241, awarded by the National Institute of Standards and Technology. The government has certain rights in the invention.

FIELD OF THE INVENTION

This invention relates generally to method of manufacturing III–V compound semiconductors to produce a Group III–V compound semiconductor device and more particularly to the method of acceptor activation of III–V nitride compound semiconductor layers in the fabrication of Group III–V nitride compound semiconductor light emitting devices.

BACKGROUND OF THE INVENTION

Successes in the growth of Group III–V nitride compound semiconductor light emitting devices for producing blue light have been published recently. Such blue light devices generally comprise $GaN/Al_xGa_{1-x}N$ layer structures formed on sapphire substrates. An important aspect in their manufacture is acceptor activation of the p-type Group III–V nitride layer such a Mg or Zn doped GaN cladding layer.

The p-type doping of Group III–V nitride compound semiconductor materials was first established in 1989 by Messieurs Akasaki and Amano at Meijo University in Japan using magnesium (Mg) as the p-type dopant in a MOCVD grown III–V nitride compound semiconductor layer. Akasaki and Amano grew p-type GaN but their as-grown films were insulating because the p-dope Mg acceptors were passivated by active hydrogen existing in the reactor. The source of the hydrogen impurities was ammonia ($NH_3$) serving as a nitrogen (N) precursor. Atomic hydrogen ($H^+$), produced by the pyrolysis of $NH_3$ is incorporated in a complex with the Mg acceptors. Overall, the Mg—H complexes are neutral so that the hydrogen renders the Mg acceptors electrically inactive. Thus, in order to activate the p-type doping, it is necessary to decompose the Mg—H complexes in the as-grown III–V nitride compound semiconductor layer. In the as-grown films of Akasaki and Amano, this was accomplished by the low energy electron beam radiation (LEEBI) process. See, for example, the article of Hirosi Amano et al., "P-type Conduction in Mg-Doped GaN Treated with Low-Energy Electron Beam Irradiation" (LEEBI), *Japanese Journal of Applied Physics*, Vol. 28 (12), pp. L2112–L2114, December, 1989.

Subsequently, in 1992, Shuji Nakamura and his coworkers demonstrated that thermal annealing was similarly effective in activating Mg acceptors in GaN films grown on sapphire substrates as disclosed in the article of Nakamura et al., "Thermal Annealing Effects on P-Type Mg-Doped GaN Films", *Japanese Journal of Applied Physics*, Vol. 31 (Part 2, No. 2B), pp. L139–L142, Feb. 13, 1992 and their companion U.S. patent to this published paper, U.S. Pat. No. 5,306,662 entitled, "METHOD OF MANUFACTURING P-TYPE COMPOUND SEMICONDUCTOR". After film growth, the samples are cooled down and transferred from the MOCVD reactor to an anneal furnace where an ex-situ thermal anneal is performed in order to achieve acceptor activation to achieve a low-resistance p-type GaN compound semiconductor. Typical anneal operations include annealing in a nitrogen atmosphere or mixed nitrogen/argon atmosphere at 1 ATM anywhere from 700° C. to 1000° C. for about 20 minutes. The anneal at 1000° C. is exemplified in the case of employing a $SiO_2$ cap layer formed over the Mg-doped GaN layer prior to ex-situ annealing to prevent decomposition of the underlying GaN compound layer during annealing. The use of any gas containing hydrogen atoms, i.e., atomic hydrogen, such as in the case of $NH_3$, upon pyrolysis, or $H_2$ per se in the annealing atmosphere is discouraged and is not preferred. In all of these cases, it is clear that the anneals are carried out as intended ex-situ anneal processes, except, as discussed below in further detail, relative to one example.

Another embodiment in U.S. Pat. No. '662 discloses annealing in a nitrogen atmosphere under a pressure of 20 ATMs to maintain the integrity and surface morphology of the film, i.e., aid in the prevention of outdiffusion of N from the GaN sample at high anneal temperatures with an $N_2$ overpressure provided on the GaN layer surface.

As indicated above, in one embodiment of Nakamura et al. in U.S. Pat. No. '662, the sample is annealed in the MOCVD reactor in the following manner. After growth of the Mg-doped GaN layer, the TMG gas and the $Cp_2Mg$ gas flow are terminated. In a continued flow of the carrier gas $H_2$ and $NH_3$, the sample in the reactor is cooled down to room temperature. This cool down process provides for the presence of both atomic nitrogen and atomic hydrogen that, respectively, aid in the prevention of the outdiffusion of N from the sample and will hydrogenate the p-doped as-grown GaN layer. Then, an anneal process is carried out after extinguishing the flow of $H_2$ and $NH_3$, introducing a $N_2$ flow, and raising the reactor temperature back up to the growth temperature regime of the GaN film, e.g. 1,000° C., and permitting the anneal to be accomplished for 20 minutes. While this is a quasi-in-situ anneal in the fact that the sample is not removed from the MOCVD reactor, the anneal process is not sequenced to occur immediately after the growth process. In other words, the reactor is returned to room temperature before proceeding with the anneal process so that there is no intended continuity with the growth process. Delay to cool down to room temperature may be as much as one half hour.

With respect to hydrogen passivation, acceptors in Group III–V nitrides are, therefore, similar to other compound semiconductor material systems, such as, for example, ZnMgSSe, AlGaAs, AlGaInP and InGaAsP, doped with acceptor species, in that each of these Group III–VI and Group III–V compound semiconductors exhibit the same phenomena of acceptor hydrogen passivation. In most of these material systems, it has been shown that a thermal anneal can be employed to activate the acceptor. In contrast, however, the nitride films are insulating before anneal while the other non-nitride material systems, mentioned above, are still p-type before anneal but somewhat of reduced conductivity as a result of hydrogen passivation. It has been established in these other Group III–V non-nitride compound semiconductors, that hydrogen is incorporated in the reactor cooldown after growth, rather than during growth. Consequently, ex-situ post-growth anneals have become a common procedure for laser diode processing. In contrast to other, better understood compound semiconductors such as AlGaAs, AlGaInP, and InGaAsP, the mechanism of acceptor passivation has not been established in the nitrides. Theoretical investigations indicate that the acceptors are passivated during growth. On the other hand, as indicated above, in the more common Group III–V arsenides and phosphides, it has already been shown that the passivation occurs during the cooldown after growth. In this case, the samples are cooled down in the presence of a hydride precursor gas, such as arsine or phosphine as the case may be, to stabilize the growth surface from decomposition. Unfortunately, the hydride pyrolysis also produces atomic hydrogen, which readily diffuses into the samples and forms an electrically neutral complex with the acceptor.

Although it is not yet clear which mechanism is involved in the Group III–V nitrides, in their basic nature, these two passivation mechanisms may, in fact, be equivalent. Overall, the behavior is simply determined by the competition between hydrogen incorporation (passivation) and hydrogen evolution (activation), both of which are expected to be strong functions relative to temperature. For instance, at high temperatures, the hydride gas is efficiently pyrolyzed, thus generating large quantities of atomic hydrogen. If this generation rate exceeds the rate at which hydrogen evaporates from the material, such as due to the hydrogen having a sufficiently strong bond, then the net effect will be passivation during growth. This equilibrium may be shifted in the opposite direction, i.e., toward activation or net hydrogen desorption, by reducing the quantity of atomic hydrogen available. Similarly, the passivation may appear to only occur during the cooldown after growth, if the hydrogen is relatively weakly bound in the lattice. In this situation, the rate of hydrogen evaporation from the crystal always exceeds the rate at which atomic hydrogen is being produced from hydride pyrolysis. As the ambient temperature is reduced, however, the rate of hydrogen desorption drops very rapidly so that within some temperature range, the desorption rate drops below the hydrogen generation rate. In this scenario, the passivation appears to occur during the cooldown after growth.

Such a simple model, which includes only the kinetics associated with the pyrolysis of the hydride (which determines the rate at which atomic hydrogen is generated and, therefore, the overpressure of atomic hydrogen), and the rate at which hydrogen is evolved from the hydrogenated sample (dictated by the strength with which hydrogen is bonded in the sample) can explain either type of behavior. It is only the relative rates of hydrogen generation and hydrogen desorption which determines whether the passivation appears to occur during growth or during cooldown.

What is needed is an in-situ process that provides acceptor activation with lower processing costs, less potential contamination from exposure to the atmosphere accompanying ex-situ processing, and improved results in acceptor activation no matter the principal cause of its passivation.

Therefore, it is an object of this invention to provide an in-situ thermal process for acceptor activation for Group III–V nitride compound semiconductors.

It is another object of this invention to provide for the production of p-type Group III–V nitride material in cases for which passivation may occur either during growth or during cooldown, as is appropriate for the given growth conditions.

It is a further object of this invention to provide an in-situ thermal process that provides for acceptor activation while concurrently preventing decomposition of the Group III–V nitride compound semiconductor film surface.

SUMMARY OF THE INVENTION

According to this invention, a method of manufacturing a p-type III–V nitride compound semiconductor utilizing vapor phase epitaxy is carried out in a MOCVD reactor by growing a III–V nitride compound semiconductor in the reactor employing a reaction gas containing a p-type impurity and then annealing in-situ the nitride compound semiconductor to bring about acceptor activation, the annealing carried out at a temperature below the growth temperature of the III–V nitride compound semiconductor during reactor cooldown. A nitrogen (N) reactant or precursor is provided in the reactor during the annealing step which can produce a reactive form of N capable of suppressing surface decomposition and does not produce atomic hydrogen.

Also, according to this invention, acceptor activation is achieved through the employment of a cap layer comprising a n-type Group III–V nitride material, e.g., n-GaN, grown on the p-doped Group III–V nitride layer preventing the occurrence of hydrogenation of the underlying p-doped layer during cool down. This non-post-growth activation eliminates the need for a subsequent thermal anneal step since any acceptor passivation is prevented in the first instance. This in-situ acceptor activation process can be described as during-growth protected activation.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1:
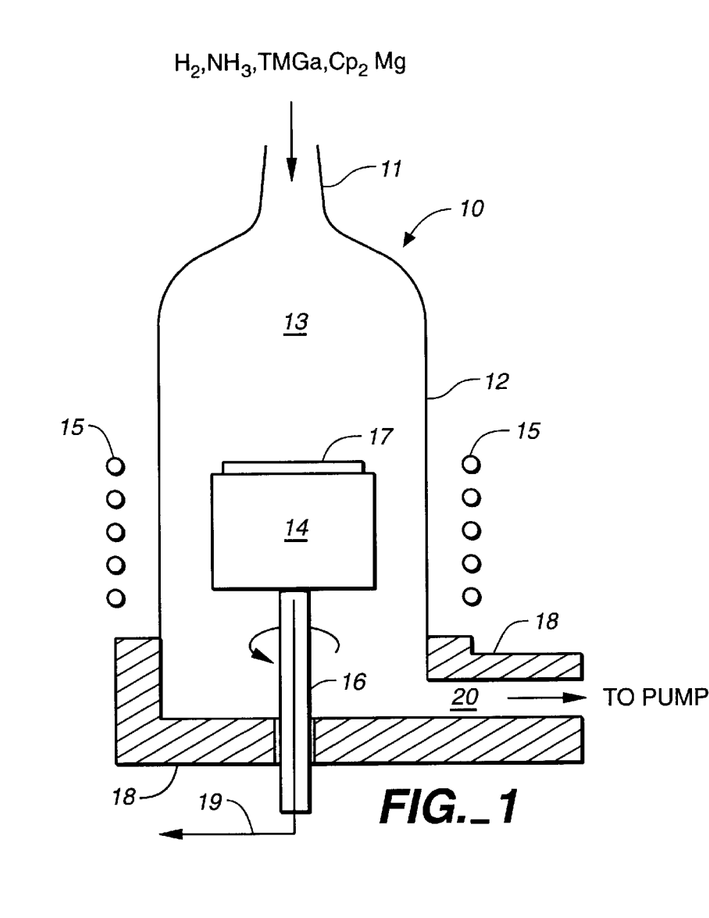
FIG. 1 is a schematic diagram of a MOCVD reactor for illustrating growth procedure of a Group III–V nitride compound semiconductor film.
Figure 2:
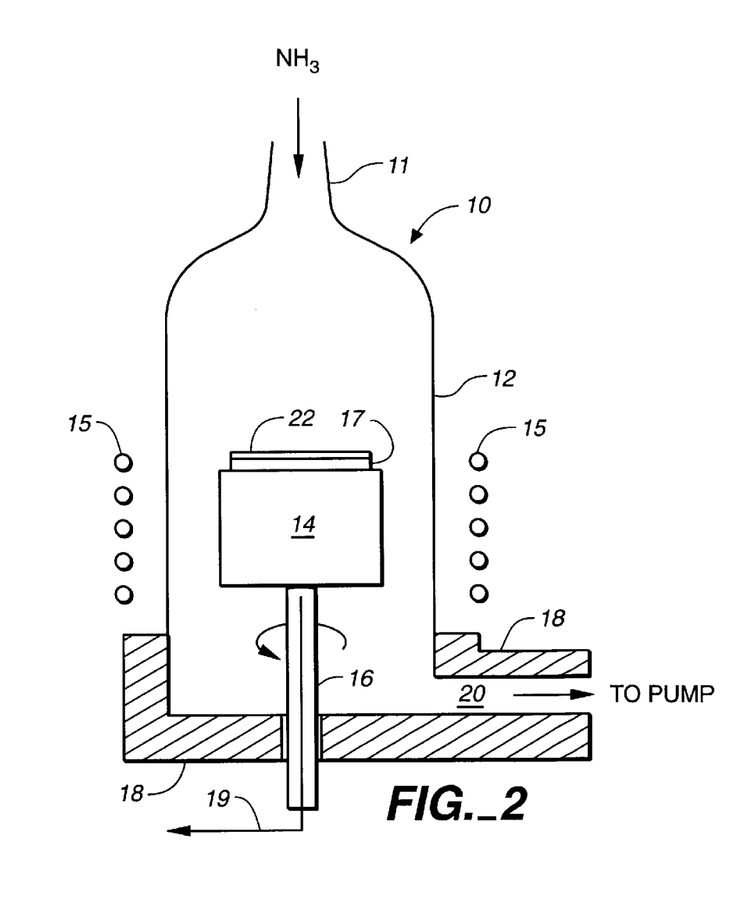
FIG. 2 is a schematic diagram of a MOCVD reactor for illustrating the first step or procedure for a first embodiment of an in-situ anneal process comprising this invention.
Figure 3:
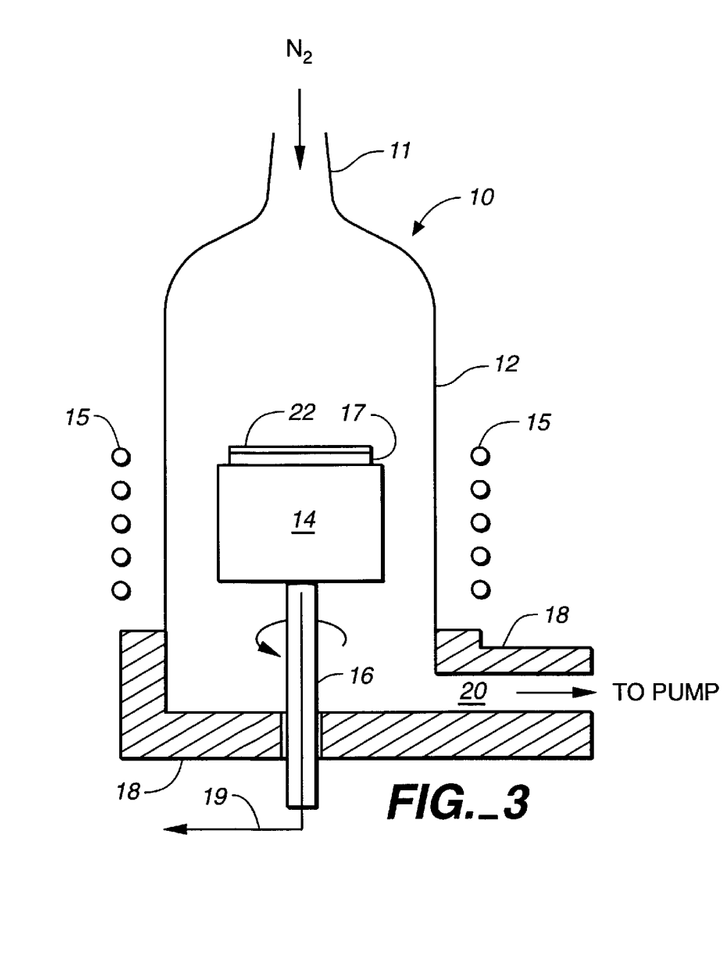
FIG. 3 is a schematic diagram of a MOCVD reactor for illustrating the second step or procedure for the first embodiment of an in-situ anneal process comprising this invention.

Reference now is made to FIGS. 1–3 illustrating the first embodiment of this invention. Shown in these figures is a diagrammatic view of a metalorganic chemical vapor deposition (MOCVD) reactor 10, also referred to as organometallic vapor phase epitaxy (OMVPE). Reactor 10 comprises a quartz tube 12 that is sealed to a base member 18 which includes a gas exhaust 20. A graphite susceptor 14 is mounted in reactor chamber 13 for rotation in reactor 10 by means of support shaft 16. Shaft 16 may have a hollow core for insertion of a fiber 19 for pyrometric measurements and monitoring. Around the outside of quartz tube 12, adjacent to and at the level of susceptor 14 in reactor chamber 13, is RF-induction heating coil 15 for heating susceptor 14 to high temperatures to bring about pyrolysis of gases near the surface of susceptor 14, which gases flowing into the reactor at inlet 11.

As is known in the art, a metalorganic compound gas serving as a reaction gas, such as triethyl gallium (TEG) or trimethyl gallium (TMG), triethyl aluminum (TEA) or trimethyl aluminum (TMA), and a N precursor, ammonia ($NH_3$), are introduced into reactor chamber 13 via inlet 11. An A-face or C-face sapphire substrate 17 is placed on the surface of susceptor 14. Then, while maintaining the epitaxial growth temperature, such as in the range of about 900° C. to about 1100° C., via RF-induction heating coil 15, an epitaxial film of a III–V Group compound is grown on substrate 14. The pressure of reactor 10 may be maintained at 1 ATM or less. By supplying suitable impurity gas during the growth of a film, a multi-layer structure made of i-type, n-type or p-type Group III–V compound semiconductors can be formed.

In general, Si is a well-known n-type impurity. However in the case of a GaN compound semiconductors, there is a tendency for such semiconductor compounds to exhibit n-type characteristics even without n-type doping. Known examples of p-type impurities are Zn, Cd, Be, Mg, Ca, and Ba. Also, it is known in the art that when a Group III–V compound semiconductor is epitaxially grown on a sapphire substrate at a high temperature, the crystal surface condition and its crystallinity will be of inferior quality. In order to avoid this condition, a buffer layer, such as GaN or AlN is first grown on the sapphire substrate usually at a lower temperature, such as about 500° C. to about 700° C., before the growth of a Group III–V nitride compound layer which is accomplished at a higher temperature. In the discussion herein, further reference to this buffer layer will not be made although it is utilized in the fabrication of Group III–V nitride semiconductor devices.

Other nitride layers follow the growth of the buffer layer. Low pressure MOCVD is practiced in the fabrication of GaN, InGaN and AlGaN layers. As is known in the art, reaction gases such as TMIn, TMGa, TMAl, TEGa and $NH_3$ are supplied to the reactor for the growth of such layers. In particular, TMGa and $NH_3$ may be provided for the growth of GaN. The carrier gas to reactor 10 may be $H_2$ or $N_2$ or a mixture of $H_2$ and $N_2$. GaN and AlGaN are grown on substrate 17 at temperatures in the range of about 900° C. to about 1100° C. while InGaN is grown at temperatures in the range of about 700° C. to about 800° C. Impurity gases $SiH_4$ and $Cp_2Mg$ are respectively provided for n-type and p-type doping. The delivery volumes of these reaction and dopant gases are known in the art, such as referenced in the previously cited article and patent of Nakamura et al.

This invention departs from the practice of Nakamura et al. in providing for nitride growth immediately followed, in situ, by acceptor activation of a p-type Group III–V nitride compound semiconductor layer during reactor cooldown so that all processing is carried out in-situ in reactor 10, i.e., without breaking vacuum. The method of this invention is generically depicted in FIG. 5 with a first step 30 comprising the growth of a p-type III–V nitride layer employing known reactant gases, followed by a step 32 of switching out of these reactant gases while including in the reactor a gas that will prevent decomposition of the as-grown III–V nitride layer when the reactor is at such high growth temperatures, in particular, the outdiffusion of N from the nitride layer. Specifically, the gas in the reactor desired for preventing such N outdiffusion is active nitrogen N, also referred to as atomic nitrogen. While this N outdiffusion preventor gas is flowing in reactor 10, the reactor can be cooled, permitting the occurrence of acceptor activation in the p-type III–V nitride layer while preventing N outdiffusion. Alternatively, reactor 10 may be rapidly cooled to a level where such N outdiffusion will not occur and the anneal treatment performed or completed, such as at a temperature of about 600° C. to about 800° C. In any case, such acceptor activation is shown as step 36 in FIG. 5. As previously indicated, acceptor activation is the process of atomic H weakly bonded to Mg or Zn dopant atoms that are broken by a thermal anneal process over a sufficient period of time. The activation process should be easily carried out in a period of about 5 minutes to about 20 minutes depending, of course, on the reactor temperature. After the proper length of time to achieve activation, the reactor is permitted to cool down to room temperature so that substrate 17 may be removed from the reactor for further processing.

Figure 5:
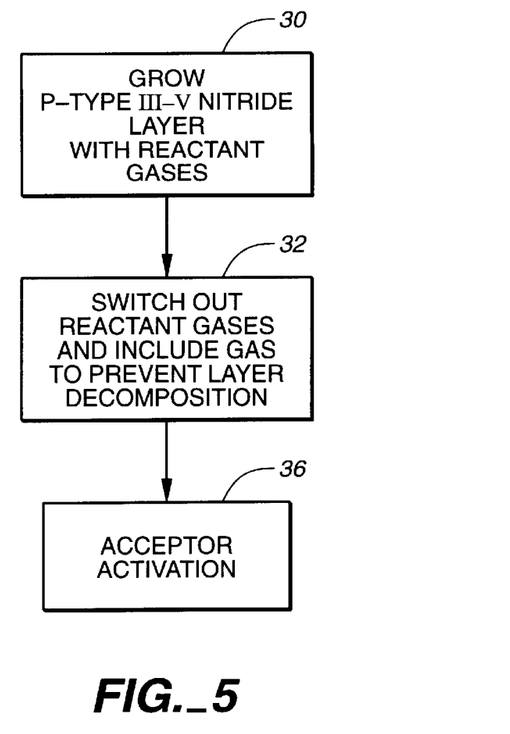
FIG. 5 is a flow diagram illustrating the generic steps or procedure for accomplishing in-situ annealing according to both the first and second embodiments of this invention.
Figure 6:
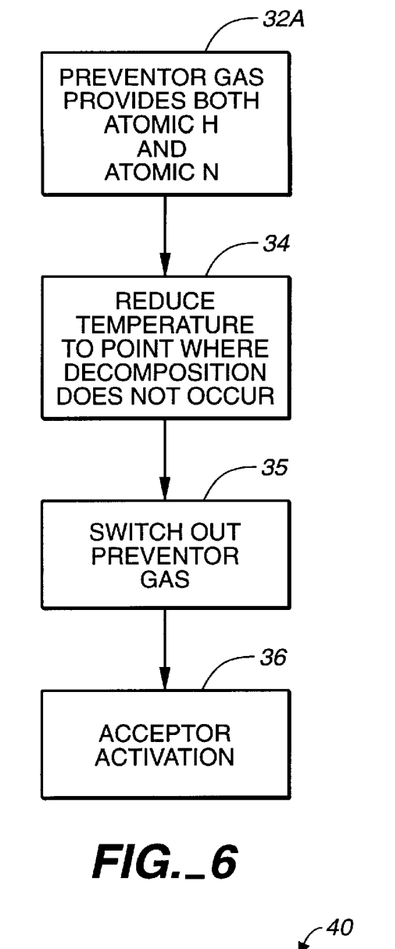
FIG. 6 is a flow diagram illustrating the specific steps or procedure for accomplishing acceptor activation according to the first embodiment of this invention.

In the practice of this invention per the first embodiment, as shown in FIG. 1 and illustrated in FIG. 6, at gas inlet 11, the carrier gas, $H_2$, is introduced with reaction gases $NH_3$ and TMGa and impurity gas $Cp_2Mg$ to form a p-type GaN layer 22, as seen completed in growth in FIG. 2. The reactor temperature during the formation of p-type GaN layer 22 is set at 900° C. which provides for better impurity concentration levels in the as-grown GaN layer compared to the use of higher growth temperatures, such as in excess of 1,000° C. This first growth step is depicted in FIG. 5 at 30, as previously indicated. Then, immediately after the growth of p-type GaN layer 22, a preventor gas is maintained in reactor 10 that provides for atomic N that prevents N outdiffusion from as-grown layer 22, as shown at step 32A in FIG. 6. In the case here, the flow of N precursor, $NH_3$, is continued in the reactor, as depicted in FIG. 2. Since the pyrolysis of $NH_3$ produces both atomic N and atomic H, the acceptor activation process cannot be initiated because of the concurrent presence of atomic H, with atomic N, inducing acceptor passivation. Thus, in step 34, the reactor 10 is cooled down to a temperature where surface decomposition of as-grown p-type GaN layer 22 will not further occur, such as may be in a range of around 600° C. to 800° C. This temperature, where little or no layer decomposition will occur, may be higher or lower depending upon reactor conditions, but the temperature sought is one where the outdiffusion of N from GaN will no longer occur. Upon attainment of this temperature, the N outdiffusion preventor gas, $NH_3$, is switched out of reactor 10, as shown in step 35 in FIG. 6, and acceptor activation is performed either as the reactor is further cooled down or at a temperature maintained for a given period of time as indicated at step 36. As an example, if the temperature is maintained at 600° C., then the time period for activation may be tens of minutes, such as, for example, between about 20 to about 40 minutes. This anneal process is indicated in FIG. 3 wherein, during the cooldown of reactor 10, a flow of molecular N, $N_2$, is maintained in the reactor as acceptor activation is carried out in the manner as just described.

A critical parameter in the activation process is the time at which $NH_3$ is switched out of reactor, after nitride layer growth or during cooldown itself, such that the remaining cooldown occurs in molecular H or N, i.e., $H_2$ or $N_2$ carrier gas or a mixture thereof. As indicated above, the $NH_3$ is left flowing into reactor 10 to prevent decomposition of the nitride layer surface. However, since this also provides a supply of atomic H at the as-grown layer surface, passivation of the dopant acceptors occurs. Thus, if $NH_3$ is switched out of reactor 10 while the sample (i.e., substrate 17 with as-grown layers including GaN layer 22) is still at an elevated temperature, the acceptors will be rendered electrically active. Thus, the temperature of $NH_3$ switchout is important. If the sample is permitted to cool down too much before the $NH_3$ gas is switched out, the p-type doped GaN layer will become or remain passivated. On the other hand, if the sample is at a high temperature for too long of a period of time without the continued flow of $NH_3$, the sample surface will decompose with the outdiffusion of N. Nevertheless, during reactor cooldown with proper timing for the switchout of the $NH_3$ gas, acceptor activation can be incorporated into the cooldown process. The $NH_3$ gas can be switched off at temperatures below the growth temperatures, i.e., below about 900° C. without damage to the GaN surface.

While the temperature for switchout of the $NH_3$ gas is around 600° C. to 800° C. as mentioned above, switchout is possible at temperatures as high as the lower end of the growth temperature range for GaN, for example, that is around 900° C. and maybe higher but not as high as around 1,000° C. With an ambient of $N_2$ provided in the reactor, activation may be accomplished in a short period of time, e.g., five minutes around 900° C. with only a tolerable amount of surface decomposition of GaN. Also, in this case the rate of cooldown is also important relative to the temperature at which the $NH_3$ gas is switched out because, the higher the temperature of the reactor, the faster the cooldown rate should be in order to avoid any possible GaN surface decomposition. Thus, a stepped or monotonically decreasing temperature cooldown cycle may be employed to allow for high temperature acceptor activation with minimal GaN surface damage. Thus, the point to achieve here is acceptor activation with a $N_2$ ambient at higher temperatures such as 850° C. to 900° C., and maybe a little higher, over a short period of time of several seconds without appreciable surface decomposition of the sample.

In the example of this first embodiment, the carrier gas employed during step 36 involving acceptor activation was $N_2$. As is known to those skilled in the art of MOCVD processing, $H_2$ is normally employed as the carrier gas in MOCVD growth. If $H_2$ could possibly pyrolyze to form atomic hydrogen, it may also contribute to acceptor passivation. However, this is considered unlikely since it has been already established relative to other Group III–V compound semiconductor materials (arsenides and the phosphides) not involving nitrogen as a grown layer component, i.e., having no N precursor involved, that it is the Group V hydride precursor, and not $H_2$ gas, that contributes to hydrogen contamination and passivation of the layers. Therefore, dehydrogenation and dopant activation will occur in $H_2$ or $N_2$ ambients or a mixture of such ambients. This notion of molecular H leads to the second embodiment of this invention.

Figure 4:
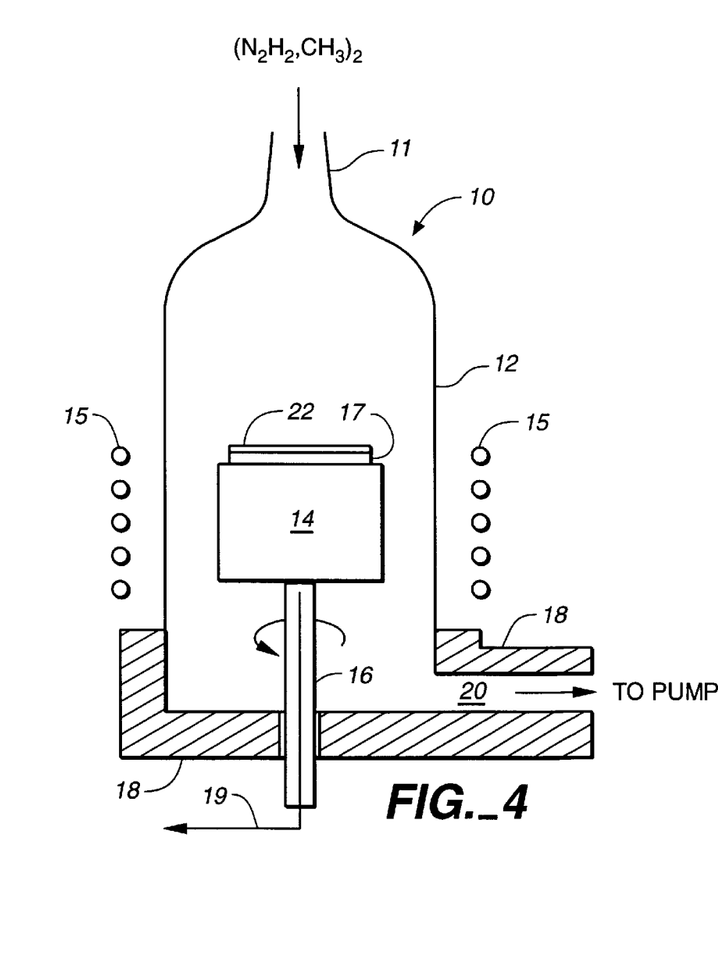
FIG. 4 is a schematic diagram of a MOCVD reactor for illustrating a second embodiment of an in-situ anneal process comprising this invention.
Figure 7:
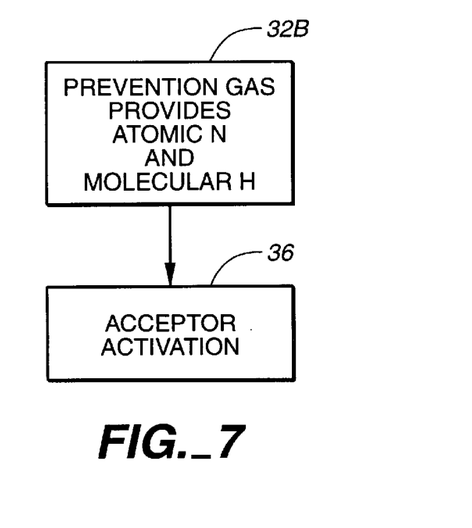
FIG. 7 is a flow diagram illustrating the specific steps or procedure for accomplishing acceptor activation according to the second embodiment of this invention.

An alternative approach for acceptor activation of an as-grown p-type Group III–V nitride layer is to employ a N precursor different from ammonia, i.e., an N precursor that has low pyrolysis temperature and does not yield atomic hydrogen, as is the case for $NH_3$. As indicated previously, hydrogen passivation of the p-type nitride layers may occur during reactor cooldown after growth, which is analogous with Group III–V arsenides and phosphides. In this connection, reference is now made to the second embodiment of this invention depicted in FIGS. 4 and 7. After the growth of p-type GaN layer, as depicted in FIG. 1, all reaction gases are switched out of reactor 10, including the N precursor in the form of $NH_3$, employed in the formation of the nitride layers, a N precursor that pyrolyzes into atomic N and molecular H is introduced into reactor 10, as indicated at step 32B in FIG. 7. It is within the scope of this invention to utilize any N precursor gas that pyrolyzes as atomic N and molecular H without producing any contaminating amount of atomic hydrogen. Available organic nitrogen sources suitable for this purpose are dimethylhydrazine (DMHz), phenylhydrazine and tertiarybutylamine or any other N precursor that pyrolyzes into atomic nitrogen and molecular hydrogen and any other nonactive byproduct that is swept away through the reactor exhaust. DMHz or $N_2H_2(CH_3)_2$ is depicted for step 32B of FIG. 5 in the reactor of FIG. 4. The advantage of such a N precursor is that acceptor activation step 36 (FIG. 7) can be carried out immediately following the end of the growth of layer 22, there being the necessary presence of atomic N to prevent the outdiffusion of N from the sample surface without the presence of atomic H. In summary, these organic N precursors pyrolyze sufficiently to stabilize the as-grown nitride surface against decomposition, but they do not produce the atomic hydrogen passivating species. The times for accomplishing the activation process will be shorter than in the case of the first embodiment since the reactor temperatures are at a higher level at the beginning of the acceptor activation process. The activation process can, therefore, be easily carried out during the cooldown of reactor 10 either controlled cooldown or natural cooldown with heating coil 15 turned off after growth.

A third embodiment of this invention is illustrated with reference to FIG. 8 which operates on the inability of hydrogen to diffuse into n-type Group III–V nitrides. It is known that atomic hydrogen will not incorporate into n-type Group III–V arsenides or into n-type Group III–V phosphide. As indicated previously, atomic H is available during growth due to pyrolysis of the Group V hydrides which may diffuse into the crystal thereby becoming available to form neutral complexes with acceptor Mg atoms. However, at higher growth temperatures, it is much more difficult for these complexes to form and, if they do, they remain unstable and may dissipate. As the temperature after growth decreases, the hydrogen in the form of these neutral acceptor-hydrogen complexes become "frozen-in" the lattice in a manner of speaking. Thus, it may be during cooldown when this process of hydrogen passivation substantially occurs, although we have not ruled out passivation during high temperature growth as explained previously.

Figure 8:
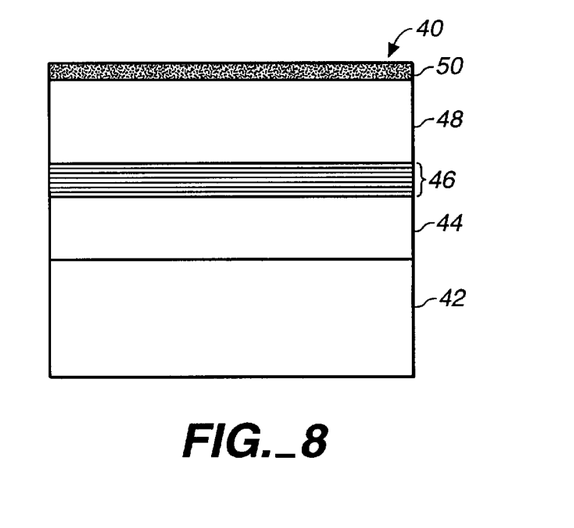
FIG. 8 is a schematic side view of a Group III–V nitride light emitting device for illustrating a third embodiment of an in-situ anneal process comprising this invention.

As shown in FIG. 8, the device 40 shown comprises a sapphire substrate 42 upon which is grown a n-type GaN cladding layer 44, doped with Si, for example, followed by the grow of an active region 46 which may be a multiple quantum wells and barriers comprising InGaN/GaN. This is followed by a p-type GaN cladding layer 48, doped with Mg, for example. Growth in the MOCVD reactor is continued with the growth of a cap layer 50 comprising n-type GaN, doped, for example, with Si. Layer 50 may have a thickness, for example, in the range of about 0.1 μm to about 1 μm. At high growth temperatures above 900° C., passivation of the p-type GaN layer 48 will have not occurred to any significant extent so that hydrogen passivation of layer 48 is prevented since it is covered with a nitride layer 50 which is impervious to hydrogen diffusion. Moreover, N outdiffusion will not occur at the reactor high growth temperatures or during reactor cooldown. Layer 50 therefore isolates p-type nitride layer 48 from the atomic-hydrogen-rich ambient due the presence of layer 50. During reactor cooldown, hydrogen passivation of p-type layer 48 cannot occur and, as a consequence, layer 48 is electrically conductive as-grown, rather than insulating. Therefore, with respect to the third embodiment, as compared to the first and second embodiments, no post-growth acceptor activation is necessary.

After growth is complete and reactor cooldown has been accomplished, n-type GaN cap layer may be removed by etching and device 40 is processed into an operable laser diode in a conventional manner, such as contacting and submount mounting.

While the method of this invention has been explained relative to Group III–V nitride compound semiconductors, the method of this invention is equally applicable to Group II–VI compound semiconductors, such as in connection with a n-doped ZnSe layer which exhibits p-type characteristics.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications as that are within the spirit and scope of the following claims.

What is claimed is:

1. A method of manufacturing a p-type III–V nitride compound semiconductor utilizing vapor phase epitaxy comprising the steps of:

growing a III–V nitride compound semiconductor in a reactor employing a reaction gas containing a p-type impurity;

annealing said nitride compound semiconductor at a temperature below the growth temperature of the III–V nitride compound semiconductor to activate acceptors of the p-type impurity;

the improvement comprising the carrying out the step of annealing in-situ in the reactor during reactor cooldown immediately after semiconductor growth in a reactor ambient comprising a nitrogen precursor of dimethylhydrazine, phenylhydrazine or tertiarybutylamine.

2. The method according to claim 1 wherein said reaction contains at least one of a gallium source of trimethyl gallium, and an aluminum source selected from the group consisting of trimethyl aluminum and triethyl aluminum, an indium source selected from the group consisting of trimethyl indium and triethyl indium, together with a nitrogen precursor.

3. The method according to claim 1 wherein the p-type impurity is at least one selected the group consisting of Zn, Cd, Be, Mg, Ca, and Ba.

4. A method of manufacturing and activating in-situ a p-type III–V nitride compound semiconductor utilizing vapor phase epitaxy in a reactor comprising the steps of:

growing in the reactor a Group III–V nitride layer with a p-type dopant utilizing at least one Group III reactant with a nitrogen reactant at a growth temperature;

discontinuing the growth of the p-type Group III–V nitride layer by switch out of the p-type dopant and all of the reactants;

introducing a nitrogen precursor in the reactor that pyrolyzes into atomic nitrogen and molecular hydrogen for preventing decomposition of the as-grown p-type Group III–V nitride layer; and reducing reactor temperature below the growth temperature to a temperature where dehydrogenation of the as-grown p-type Group III–V nitride layer is achieved while controlling the rate of reactor cooling in a temperature range conducive to p-type acceptor activation for a period of time sufficient for activation of the p-type acceptors of the p-type dopant in the as-grown p-type Group III–V nitride layer.

5. The method of manufacturing and activating in-situ of claim 4 further comprising the steps of:

discontinuing the flow of the nitrogen reactant in the reactor at a given temperature and permitting the occurrence of activation of the p-type acceptors.

6. The method of manufacturing and activating in-situ of claim 5 wherein said discontinuance of flow of the nitrogen reactant is below 900° C.

7. The method of manufacturing and activating in-situ of claim 4 wherein said reactor temperature is monotonically reduced.

8. The method of manufacturing and activating in-situ of claim 4 wherein said reactor temperature is reduced in steps.

9. The method of manufacturing and activating in-situ of claim 4 wherein said reactor temperature is reduced to a first level for a period of time to permit the occurrence of activation and then further reduced to a second level where the flow of the nitride precursor is terminated.

10. The method of manufacturing and activating in-situ of claim 4 wherein said nitrogen precursor comprises dimethylhydrazine, phenylhydrazine or tertiarybutylamine.

11. The method of manufacturing and activating in-situ of claim 4 wherein the nitrogen reactant comprises ammonia and comprises the further steps of:

reducing the temperature in the reactor from the growth temperature to a temperature where decomposition of the as-grown p-type Group III–V nitride layer will not substantially occur in the presence of ammonia;

switching out of the reactor the ammonia and continuing with the steps of introducing the nitrogen precursor and controlling the rate of reactor cooling to permit acceptor activation.

12. The method of manufacturing and activating in-situ of claim 11 wherein, during cooldown, the reactor temperature is held at a given temperature for a predetermined period of time to permit completion of acceptor activation.

13. The method of manufacturing and activating in-situ of claim 11 wherein, during cooldown, the temperature of the reactor is monotonically reduced during a period of time to permit completion of acceptor activation.

14. The method of manufacturing and activating in-situ of claim 11 wherein said reactor temperature is monotonically reduced.

15. The method of manufacturing and activating in-situ of claim 11 wherein said reactor temperature is reduced in steps.

16. A method of manufacturing and activating in-situ a p-type III–V nitride compound semiconductor utilizing vapor phase epitaxy in a reactor comprising the steps of:

growing in the reactor a III–V nitride compound semiconductor in a reactor employing a reaction gas containing a p-type impurity utilizing at least one Group III reactant with a nitrogen reactant at a growth temperature;

switching out of the reactor the Group III reactant or reactants while continuing the flow of the nitrogen reactant to prevent surface decomposition of the as-grown III–V nitride compound semiconductor;

reducing the temperature in the reactor from the growth temperature to a temperature where decomposition of the as-grown III–V nitride compound semiconductor will not substantially occur;

switching out of the reactor the nitrogen reactant at a temperature where significant decomposition of the as-grown III–V nitride compound semiconductor will not occur and switching in a combined ambient gas permitting acceptor activation, said combined ambient gas comprising $N_2$ and $H_2$;

controlling the rate of cooldown in the presence of said combined ambient gas within a temperature range in which acceptor activation occurs until activation is completed; and thereafter, cooling the reactor to room temperature.

17. The method of manufacturing and activating in-situ of claim 16 wherein said nitrogen reactant is $NH_3$.

18. The method of manufacturing and activating in-situ of claim 16 wherein the temperature of the reactor is monotonically decreased during acceptor activation.

19. The method of manufacturing and activating in-situ of claim 18 wherein said monotonical decrease in temperature is continuous.

20. The method of manufacturing and activating in-situ of claim 18 wherein said monotonical decrease in temperature is accomplished in a stepped manner.

21. The method of manufacturing and activating in-situ of claim 16 wherein the growth of said III–V nitride compound semiconductor takes place at a temperature below 1,000° C. but above about 850° C. and said activation takes place at a temperature at about 850° C. or less.

22. The method of manufacturing and activating in-situ of claim 21 wherein the semiconductor growth takes place at around the temperature of 900° C.

23. The method of manufacturing and activating in-situ of claim 16 wherein, during the step of reactor temperature reduction where decomposition of the as-grown III–V nitride compound semiconductor will substantially occur, a flow of $NH_3$ is maintained in the reactor until the temperature of the reactor is reduced to a temperature in the range of about 600° C. to about 800° C., after which the $NH_3$ flow is switched out of the reactor.

24. The method of manufacturing and activating in-situ of claim 16 wherein the acceptor activation temperature range is in a range of about 600° C. to about 900° C.

25. The method of manufacturing and activating in-situ of claim 16 wherein the step of switchout of the nitrogen reactant occurs in a temperature range of about 600° C. to about 900° C.

26. A method of manufacturing a p-type III–V nitride compound semiconductor utilizing vapor phase epitaxy comprising the steps of:

growing a III–V nitride compound semiconductor layer on a substrate in a reactor employing a reaction gas containing a p-type impurity; and growing a III–V nitride compound semiconductor cap layer on the p-type III–V nitride compound semiconductor layer in a reactor employing a reaction gas containing a n-type impurity to prevent hydrogen passivation of the p-type III–V nitride compound semiconductor layer during subsequent growth or cooldown.

27. The method of claim 26 wherein said the p-type III–V nitride compound semiconductor layer comprises p-GaN and said the n-type III–V nitride compound semiconductor cap layer comprises n-GaN.

28. The method of claim 27 wherein the p-type impurity is at least one selected the group consisting of Zn, Cd, Be, Mg, Ca, and Ba.

29. The method of claim 26 further comprising the step of removing the n-type III–V nitride compound semiconductor cap layer and forming a metal ohmic contact with the p-type III–V nitride compound semiconductor layer.

* * * * *